US006130120A

United States Patent [19]
Park

[11] Patent Number: 6,130,120
[45] Date of Patent: Oct. 10, 2000

[54] METHOD AND STRUCTURE FOR CRYSTALLIZING A FILM

[75] Inventor: Min Hwa Park, Chungcheongbuk-do, Rep. of Korea

[73] Assignee: Goldstar Electron Co., Ltd., Chungcheongbuk-Do, Rep. of Korea

[21] Appl. No.: 08/895,884

[22] Filed: Jul. 17, 1997

Related U.S. Application Data

[63] Continuation of application No. 08/367,813, Jan. 3, 1995, Pat. No. 5,681,760.

[51] Int. Cl.[7] .................. H01L 21/324; H01L 21/225
[52] U.S. Cl. .................. 438/166; 438/158; 438/487; 438/488; 438/535; 438/795; 438/563; 148/DIG. 91
[58] Field of Search ................ 438/158, 166, 438/486, 487, 488, 535, 479, 795, FOR 333, FOR 334, FOR 418, FOR 419, 563; 427/554, 555; 148/DIG. 91, DIG. 92, DIG. 93, DIG. 94

[56] References Cited

U.S. PATENT DOCUMENTS

| | | |
|---|---|---|
| 4,463,028 | 7/1984 | Laude ........................ 427/554 |
| 4,628,589 | 12/1986 | Sundaresan . |
| 5,162,892 | 11/1992 | Hayashi et al. . |
| 5,438,014 | 8/1995 | Hashimoto . |
| 5,541,119 | 7/1996 | Kodama . |
| 5,656,556 | 8/1997 | Yang ........................ 438/646 |
| 5,858,473 | 1/1999 | Yamazaki et al. ........ 427/554 |
| 5,858,559 | 1/1999 | Barbour et al. ........... 428/690 |
| 5,888,841 | 3/1999 | Snyder ........................ 438/33 |

FOREIGN PATENT DOCUMENTS

| | | |
|---|---|---|
| 59-21067 | 2/1984 | Japan . |
| 63-292632 | 11/1988 | Japan . |
| 6-333822 | 12/1994 | Japan . |

OTHER PUBLICATIONS

Wolf et al., Silicon Processing for the VLSI Era, vol. 1: Process Technology, Lattice Press, pp. 57–58 (1986).

*Primary Examiner*—Mary Wilczewski

[57] ABSTRACT

A method and structure for crystallizing film is disclosed. The method includes the steps of forming a film on a substrate, forming a lens on the film to focus an electromagnetic wave on the film and directing the electromagnetic wave on the film inclusive of the lens to crystallize the film.

11 Claims, 6 Drawing Sheets

NO GRAIN BOUNDARY
WHICH PASSES THROUGH
SOURCE "S" AND DRAIN "D"

METHOD AND STRUCTURE FOR CRYSTALLIZING A FILM

This application is a continuation of application Ser. No. 08/367,813, filed on Jan. 3, 1995, now U.S. Pat. No. 5,681,760, the entire contents of which are hereby incorporated by reference.

BACKGROUND OF THE INVENTION

The present invention relates to a method for manufacturing a thin film transistor, and particularly to a method for manufacturing a thin film transistor which is applicable to a SRAM (static random access memory) and liquid crystal display device.

In the conventional method for manufacturing a thin film transistor, a bottom gate and a top gate are used. And polysilicone for forming a body layer is manufactured by enlarging the particle size using solid phase growing method. The solid phase growing method for the body polysilicone layer according to the conventional method is carried out by heat treating at about 600° C. for about 24 hours.

Recently, an attempt to increase the crystallization degree by RTA (rapid thermal annealing) is made. However, this increases production cost and is difficult to proceed in batch type.

A plasma $H_2$ passivation used to be applied to obtain on/off current ratio ($I_{on}/I_{off}$) of $10^6$ or above.

The conventional method for manufacturing the thin film transistor will be described below referring to the attached FIG. 1.

First, a gate electrode 2 is formed by depositing conductive material such as polysilicone on an insulating layer 1 formed on a substrate (not shown) and patterning thereof through a photolithography as shown in FIG. 1A.

After then, a gate oxide 3 and a body polysilicone layer 4 are sequentially formed by CVD (chemical vapor deposition) on the whole surface of the insulating layer 1 in which the gate electrode 2 is formed, and channel ions are implanted.

As shown in FIG. 1B, photoresist 5 is coated on the body polysilicone layer 4 and is selectively exposed and developed to form a prescribed photoresist pattern to define a channel region and an offset region on the body polysilicone layer 4. At this time, the region covered with the photoresist 5 becomes the channel region and the offset region. Ion implantation is carried out to form an LDD (light doped drain) region 11 using the photoresist pattern 5 defining the channel region and the offset region as an ion implantation mask.

The photoresist pattern 5 defining the channel region and the offset region is removed and then photoresist 6 is coated again, selectively exposed and developed to form a photoresist pattern 6 defining a source region and a drain region. Ion implantation is carried out using this photoresist pattern 6 as a mask to form the source region and the drain region 12 to complete the manufacture of the thin film transistor as shown in FIG. 1C.

FIG. 2 is a schematic cross-sectional view of the channel region formed on the body polysilicone layer 4 of the thin film transistor manufactured by the conventional method.

According to the conventional method, a problem of leakage current generation by the grain boundary A which passes through the source S and the drain D as shown in FIG. 2 occurs.

Moreover, since the offset region and the source and the drain region are defined using the photoresist, the lengths of the channel region and the offset region are changed according to the degree of the overlay misalign, and stable device characteristic could be hardly obtained.

SUMMARY OF THE INVENTION

An object of the present invention is to solve the above-mentioned problem and to provide a method for manufacturing a thin film transistor having high reliance and is reproductive.

To accomplish the object, there is provided in the present invention a method for manufacturing a thin film transistor comprising the steps of forming a polysilicone layer on a substrate, forming an impurity-containing layer on the polysilicone layer, forming a prescribed pattern by patterning the impurity-containing layer, flowing the impurity-containing layer by heat treating and crystallizing the polysilicone layer by annealing using a prescribed light source.

BRIEF DESCRIPTION OF THE DRAWINGS

The above object and advantages of the present invention will become more apparent by describing in detail a preferred embodiment thereof with reference to the attached drawings in which.

Figure 1A:
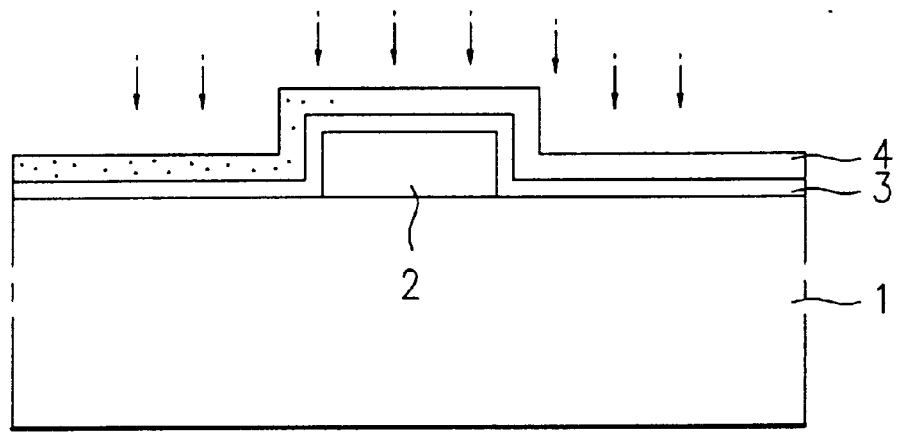
FIG. 1 is a flow diagram illustrating the conventional method for manufacturing the thin film transistor.
Figure 1B:
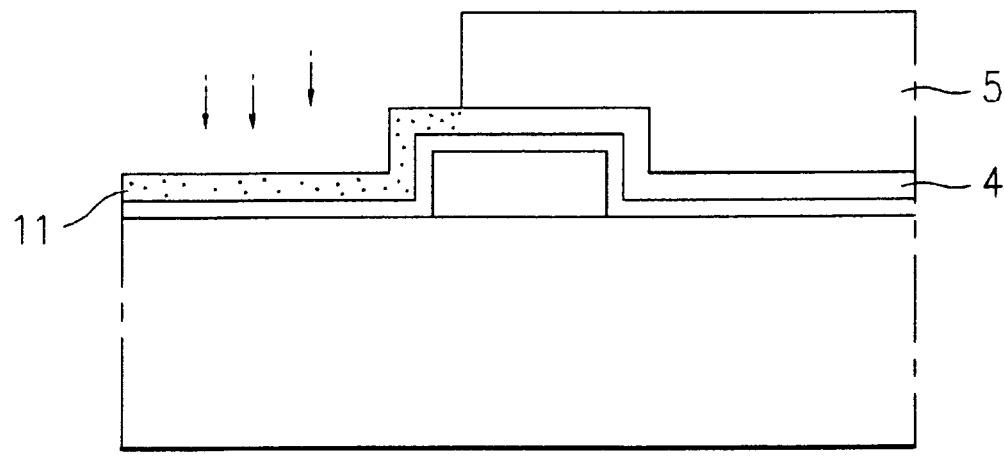
Figure 1C:
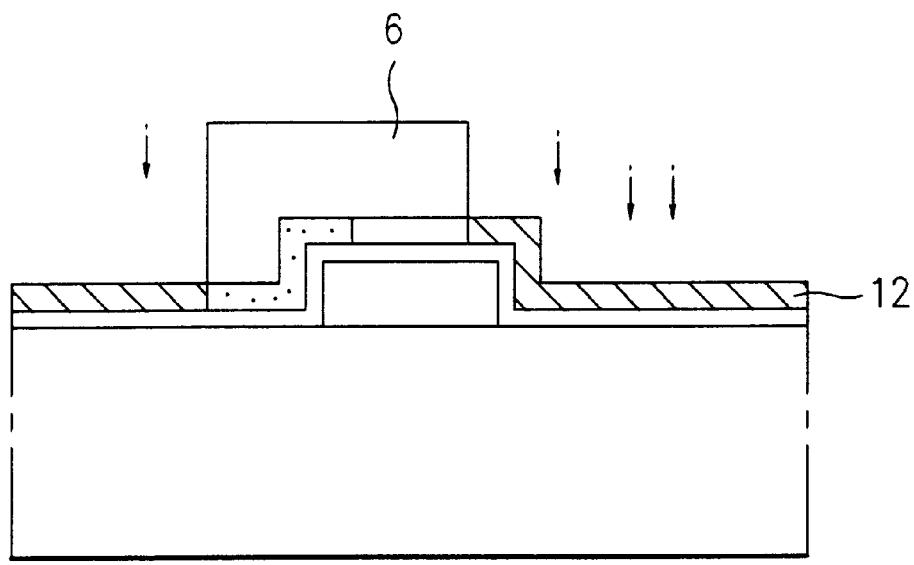
Figure 1D:
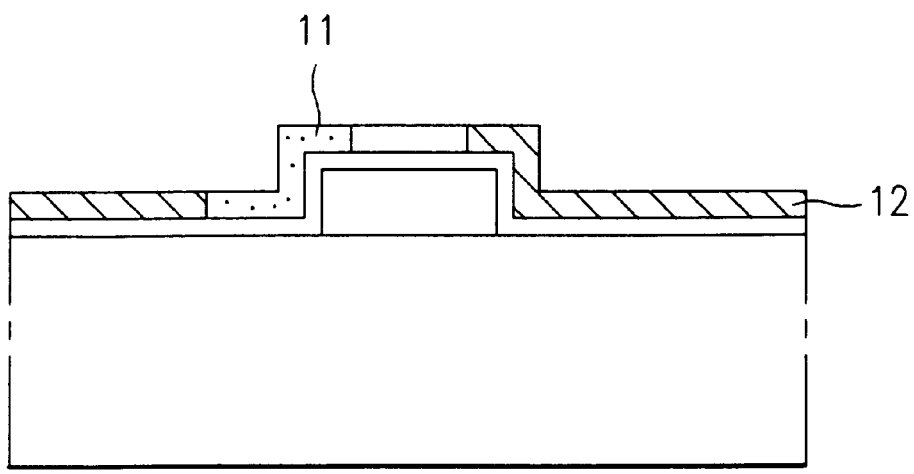
Figure 2:
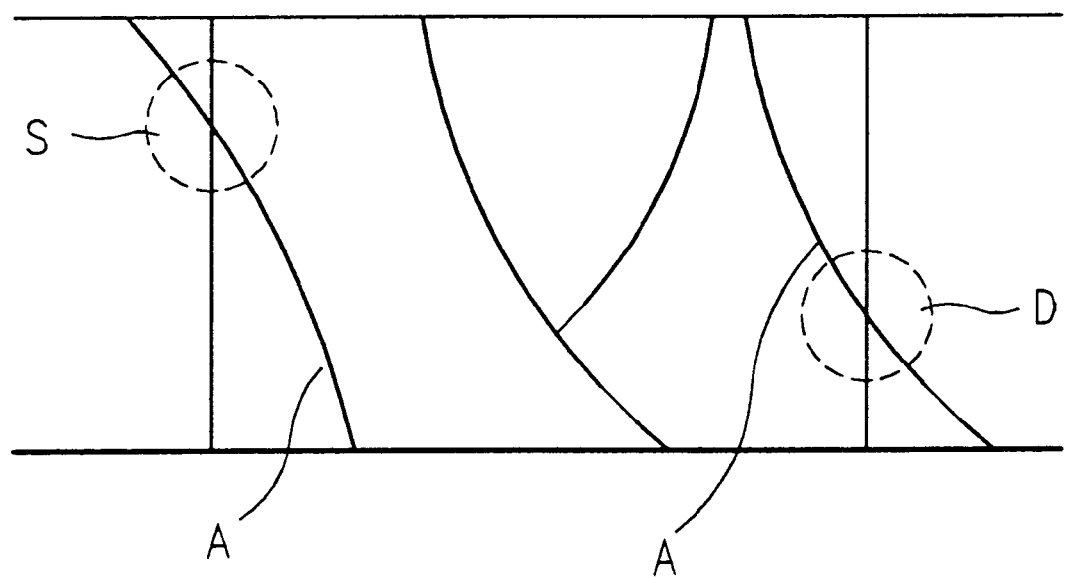
FIG. 2 is a schematic cross-sectional view at the portion of the channel of the thin film transistor manufactured by the conventional method.

*designation of the numerals at the important portion in the drawings*

1 . . . an insulating layer
2 . . . a gate electrode
3 . . . a gate insulating layer
4 . . . a body layer
8 . . . an impurity-containing layer (BPSG layer or PSG layer)
9 . . . photoresist pattern

DETAILED DESCRIPTION OF THE INVENTION

The present invention will be described in detail below referring to the attached drawings.

FIG. 3 is a flow diagram illustrating the method for manufacturing the thin film according to the present invention.

Figure 3A:
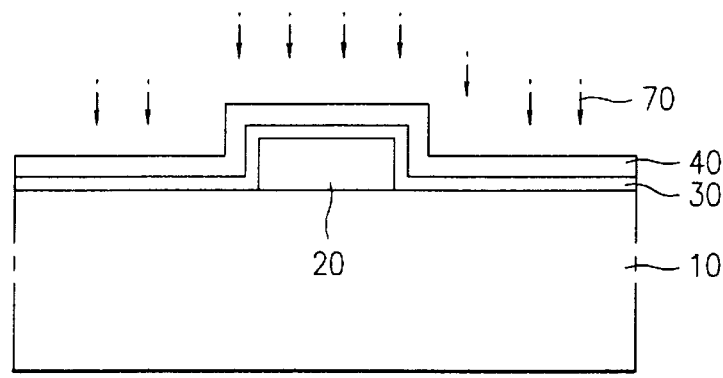
FIG. 3 is a flow diagram illustrating the method for manufacturing the thin film according to the present invention.

First, a gate electrode 2 is formed by depositing conductive material such as polysilicone on an insulating layer 1 formed on a substrate (not shown) and patterning thereof using a photolithography as shown in FIG. 3A.

After then, a gate oxide 3 and a body polysilicone layer 4 are sequentially formed by CVD (chemical vapor deposition) method on the whole surface of the insulating layer 1 where the gate electrode 2 is formed, and ion implantation 7 is carried out for forming a channel region.

Figure 3B:
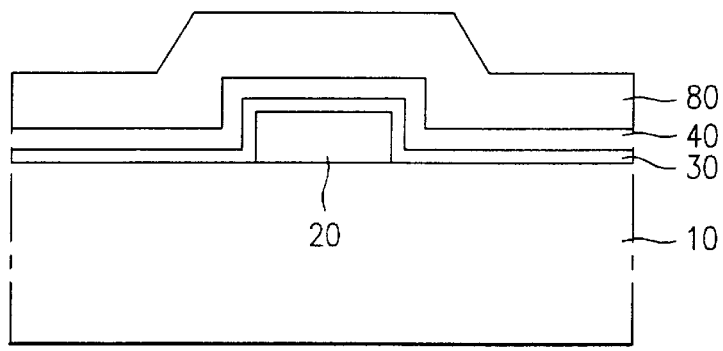

As shown in FIG. 3B, an impurity-containing layer such as BPSG 8 (borophospho-silicate glass; in case of P-type thin film transistor) or PSG (phospho-silicate glass; in case of N-type thin film transistor) is deposited on the body polysilicone layer 4 using the CVD method. The BPSG layer (or the PSG layer) 8 is formed while controlling the thickness thereof according to the wavelength of the light source to be used in the following crystallization process. It is preferred that the BPSG layer is formed by washing using SC-1 and HF after the channel ion implantation.

Figure 3C:
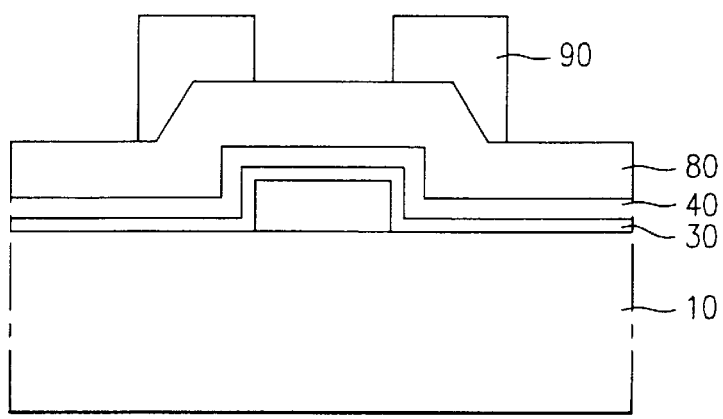

As shown in FIG. 3C, photoresist 9 is coated on the BPSG layer (or the PSG layer) and is patterned using a photolithography to define a source region and a drain region. At this time, the portion covered with the photoresist 9 becomes the source region and the drain region, while the body polysilicone layer portion exposed between the source region and the drain region becomes the channel region.

Figure 3D:
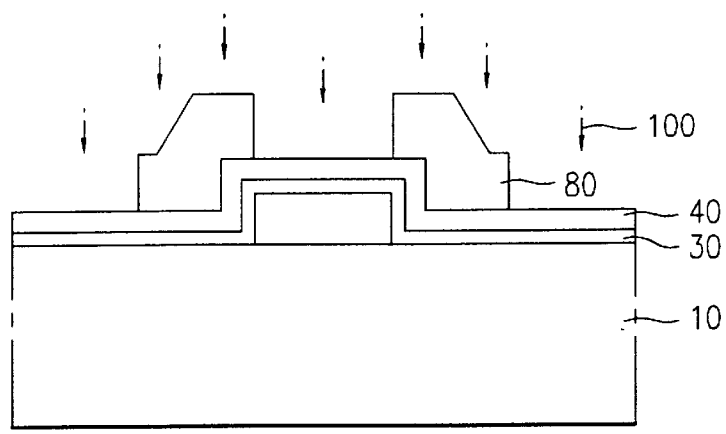
Figure 3E:
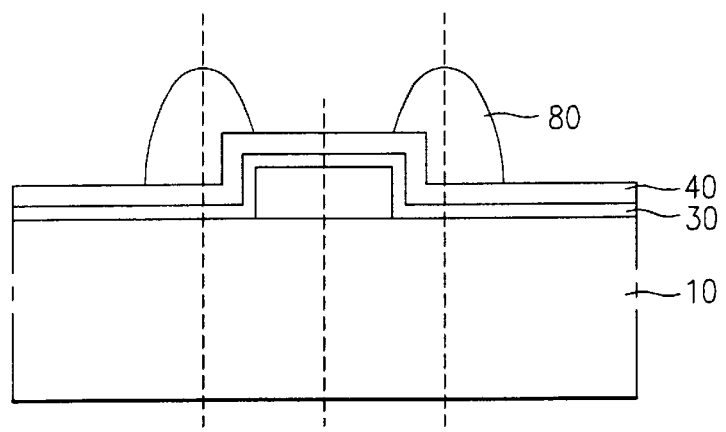
Figure 3F:
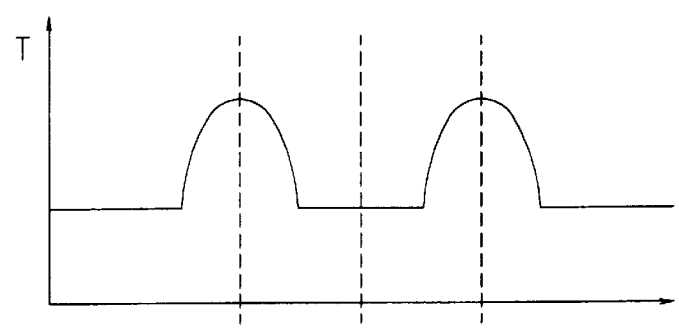

Next, as shown in FIG. 3D, the BPSG layer (or the PSG layer) 8 is etched using the photoresist pattern 9 as a mask. After removing the photoresist, heat treatment is carried out for flowing the BPSG layer (or the PSG layer) 8 as shown in FIG. 3E. The body polysilicone layer in the channel region is crystallized by annealing using a prescribed light source. At this time, RTP (rapid thermal process) or focused laser can be used as the light source.

Meanwhile, since flowability of the BPSG (or the PSG) is changed according to the concentration of boron (or phosphorous) in the BPSG (or PSG), and optimized radius of curvature of the flowed state of the BPSG (or PSG) is changed according to the wavelength of the light source used when crystallizing the channel region, the time and temperature of the heat treating of the BPSG layer should be appropriately controlled to obtain desirable flowability and radius of curvature.

The impurity in the BPSG layer (or the PSG layer) 8 diffuses into the body polysilicone layer 4 during the heat treatment to form the source and the drain region while flowing the BPSG layer (or the PSG layer) to form the shape as shown in FIG. 3E. Therefore, during crystallization of the body polysilicone layer, i.e. the channel region, the BPSG layer (or the PSG layer) plays the role of a micro-lens to give the temperature distribution illustrated in FIG. 3F.

The partial temperature difference affects the nucleation and the growing rate during the crystallization of the amorphous silicone and this results that the particle size at the interface of the source and the drain region and the channel region is larger than that at the channel region.

In conclusion, the grain boundary which passes through the boundary of the source and the drain region with the channel region can be effectively reduced or increased under the given thermal budget.

Figure 4:
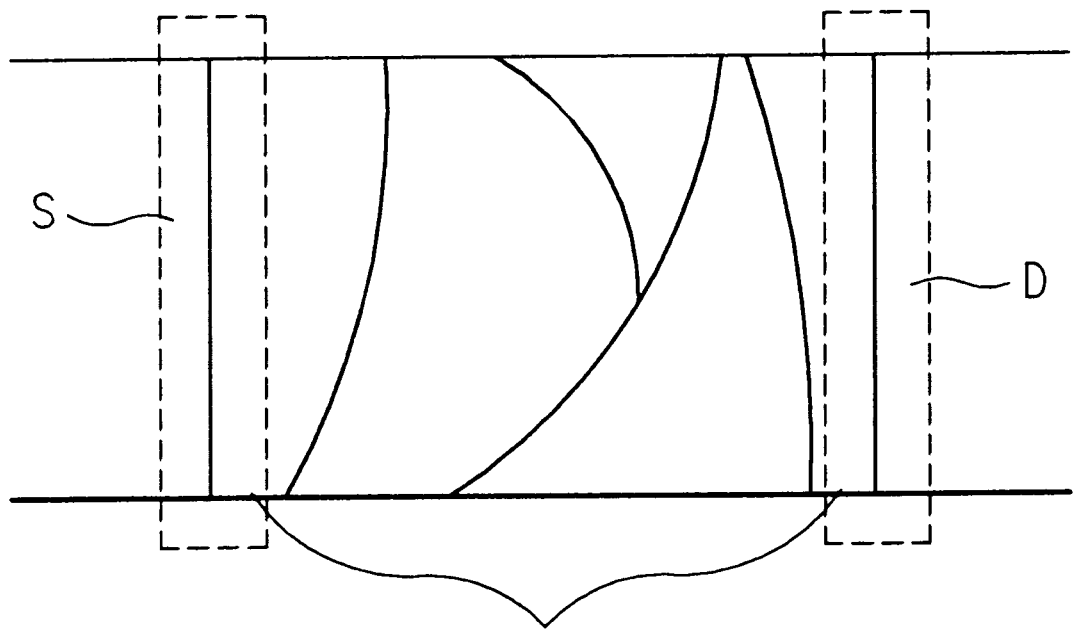
FIG. 4 is a schematic cross-sectional view at the portion of the channel of the thin film transistor manufactured by the method of the present invention.

FIG. 4 is a schematic cross-sectional view at the portion of the channel of the thin film transistor manufactured by the method of the present invention. No grain boundary which passes through the source S and the drain region D is observed due to the partial temperature difference during the crystallization as described above.

During the process illustrated in FIG. 3D, ion implantation 10 to form an LDD structure could be carried out before heat treating the BPSG layer. In this case, if the ion implantation 10 is followed by the BPSG flowing, the offset region came to be defined by the difference of the lateral dimension range of the BPSG layer before and after the flowing as shown in FIG. 3D and FIG. 3E.

The ion implantation for forming the source and the drain region which has been carried out in the conventional method can be replaced with the auto doping of boron (or phosphorous) from the BPSG layer (or the PSG layer) during the flowing of the BPSG layer (or the PSG layer) or during the annealing for crystallizing the channel region. In this method, the mask process for patterning the BPSG layer (or the PSG layer) is added, while the ion implantation process is eliminated. This is at last advantageous in simplifying the whole process.

As described above, according to the present invention, the leakage owing to the grain boundary which passes through the source region and the drain region can be largely reduced and the off current can be lowered. And since the source and drain region can be self-align formed, the change in channel length due to the overlay misalign which may occur when forming the source and the drain region by photolithography using photoresist can be basically eliminated.

Moreover, in case of applying the LDD structure, the length of the offset region due to the difference of the lateral dimension region of the BPSG layer (or the PSG layer) before and after the flowing can be reproductively controlled.

What is claimed is:

1. A method for crystallizing a film, comprising steps of forming a film on a substrate;

forming a micro-lens in contact with the film to focus an electro-magnetic wave onto the film; and directing the electro-magnetic wave on the film inclusive of the lens to crystallize the film.

2. The method for crystallizing a film as claimed in claim 1, wherein the film includes a recrystallizable material.

3. The method for crystallizing a film as claimed in claim 2, wherein the recrystallizable material includes a semiconductor.

4. The method for crystallizing a film as claimed in claim 3, wherein the semiconductor includes one of polysilicon and amorphous silicon.

5. The method for crystallizing a film as claimed in claim 2, wherein a grain size of the film formed under the lens is greater than a grain size of the film formed without the lens.

6. The method for crystallizing a film as claimed in claim 1, wherein the lens is formed of an impurity-containing layer.

7. The method for crystallizing a film as claimed in claim 6, wherein the impurity-containing layer is one of a P-type impurity layer and an N-type impurity layer.

8. The method for crystallizing a film as claimed in claim 6, wherein the impurity-containing layer is one of a PSG film and a BSG film.

9. The method for crystallizing a film as claimed in claim 1, the step of forming the lens including steps of:

forming an impurity-containing layer on the film;

selectively removing the impurity-containing layer to form a lens pattern; and flowing the lens pattern to form the lens.

10. The method for crystallizing a film as claimed in claim 1, wherein the electro-magnetic wave is generated by a laser.

11. The method for crystallizing a film as claimed in claim 1, wherein a partial temperature difference is created on the film.

* * * * *